US012740340B2

(12) United States Patent
Gil et al.

(10) Patent No.: US 12,740,340 B2
(45) Date of Patent: Sep. 15, 2026

(54) SEMICONDUCTOR DEVICE AND METHOD OF MANUFACTURING THE SAME

(71) Applicant: SAMSUNG ELECTRONICS CO., LTD., Suwon-si (KR)

(72) Inventors: Yuna Gil, Suwon-si (KR); Sumin Yu, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 303 days.

(21) Appl. No.: 18/753,280

(22) Filed: Jun. 25, 2024

(65) Prior Publication Data

US 2025/0089583 A1 Mar. 13, 2025

(30) Foreign Application Priority Data

Sep. 7, 2023 (KR) ........................ 10-2023-0118905

(51) Int. Cl.
*H10N 70/00* (2023.01)
*H10B 63/00* (2023.01)

(52) U.S. Cl.
CPC ........... *H10N 70/841* (2023.02); *H10B 63/24* (2023.02); *H10B 63/84* (2023.02); *H10N 70/063* (2023.02); *H10N 70/8828* (2023.02)

(58) Field of Classification Search
CPC ..... H10N 70/063; H10N 70/066; H10B 63/84
See application file for complete search history.

(56) References Cited

U.S. PATENT DOCUMENTS

| | | | |
|---|---|---|---|
| 9,362,340 | B2 | 6/2016 | Terai et al. |
| 9,704,923 | B1 | 7/2017 | Bernhardt et al. |
| 10,403,817 | B2 | 9/2019 | Song et al. |
| 10,811,462 | B2 | 10/2020 | Terai |
| 11,094,745 | B2 | 8/2021 | Kim et al. |
| 11,121,181 | B2 | 9/2021 | Nayaz |
| 11,387,410 | B2 | 7/2022 | Park et al. |
| 2021/0313398 | A1 | 10/2021 | Kim et al. |

FOREIGN PATENT DOCUMENTS

KR 10-2365684 B1 2/2022

*Primary Examiner* — Amar Movva
(74) *Attorney, Agent, or Firm* — Morgan, Lewis & Bockius LLP

(57) ABSTRACT

A semiconductor device includes a word line extending in a first direction. A bit line extends on the word line in a second direction intersecting the first direction. A memory cell is disposed between the word line and the bit line. The memory cell includes a lower electrode, a selection element, and an upper electrode sequentially disposed on the word line. A filling pattern is on a side surface of the memory cell. An etch stop pattern includes an insulating material between the filling pattern and the bit line. A lower surface of the etch stop pattern is positioned at a higher level than a level of a lower surface of the upper electrode.

20 Claims, 18 Drawing Sheets

SEMICONDUCTOR DEVICE AND METHOD OF MANUFACTURING THE SAME

CROSS-REFERENCE TO RELATED APPLICATIONS

This application claims priority under 35 U.S.C. § 119 to Korean Patent Application No. 10-2023-0118905, filed on Sep. 7, 2023 in the Korean Intellectual Property Office, the disclosure of which is incorporated by reference in its entirety herein.

1. TECHNICAL FIELD

The present inventive concept relates to a semiconductor, and more specifically relates to a semiconductor device and a method of manufacturing the same.

2. DISCUSSION OF RELATED ART

Existing resistive memory devices (RRAM, PRAM, MRAM) have a memory material that stores a resistance state and a separate switch (e.g., transistor, diode, threshold switch, etc.). However, an OTS-only memory (selector only memory) which is a device in which a single chalcogenide-based material has both memory and selector characteristics, may be implemented with a simple structure of stacking upper and lower electrodes and SOM material, thereby increasing integration. However, in the case of a two-dimensional cell array structure, leakage current may increase as the cell array size increases, and thus a three-dimensional vertical cross-point memory structure has been recently proposed.

SUMMARY

An object of embodiments of the present inventive concept is to provide a semiconductor device with increased reliability.

An object of embodiments of the present inventive concept is to provide a semiconductor device with increased integration.

However, the problems to be solved by embodiments of the present inventive concept are not limited to the problems mentioned above, and other problems not mentioned will be clearly understood by those skilled in the art from the description below.

According to an embodiment of the present inventive concept, a semiconductor device includes a word line extending in a first direction. A bit line extends on the word line in a second direction intersecting the first direction. A memory cell is disposed between the word line and the bit line. The memory cell includes a lower electrode, a selection element, and an upper electrode sequentially disposed on the word line. A filling pattern is on a side surface of the memory cell. An etch stop pattern includes an insulating material between the filling pattern and the bit line. A lower surface of the etch stop pattern is positioned at a higher level than a level of a lower surface of the upper electrode.

According to an embodiment of the present inventive concept, a semiconductor device includes a word line extending in a first direction. A bit line extends on the word line in a second direction intersecting the first direction. A memory cell is disposed between the word line and the bit line. The memory cell includes a lower electrode, a selection element, and an upper electrode sequentially disposed on the word line. A filling pattern is on a side surface of the memory cell. An etch stop pattern includes an insulating material between the filling pattern and the bit line. The filling pattern has a first upper surface below the bit line. The first upper surface of the filling pattern is positioned at a higher level than a level of a lower surface of the upper electrode.

According to an embodiment of the present inventive concept, a semiconductor device includes a word line extending in a first direction. A bit line extends on the word line in a second direction intersecting the first direction. A memory cell is disposed between the word line and the bit line. The memory cell includes a lower electrode, a selection element, and an upper electrode sequentially disposed on the word line. A filling pattern is on a side surface of the memory cell. An etch stop pattern includes an insulating material between the filling pattern and the bit line. The upper electrode is in direct contact with an upper surface of the selection element and a lower surface of the bit line. A lower surface of the etch stop pattern is positioned at a higher level than a level of a lower surface of the upper electrode.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION OF EMBODIMENTS

Hereinafter, to explain the present inventive concept in detail, non-limiting embodiments of the present inventive concept will be described with reference to the accompanying drawings.

Figure 1:
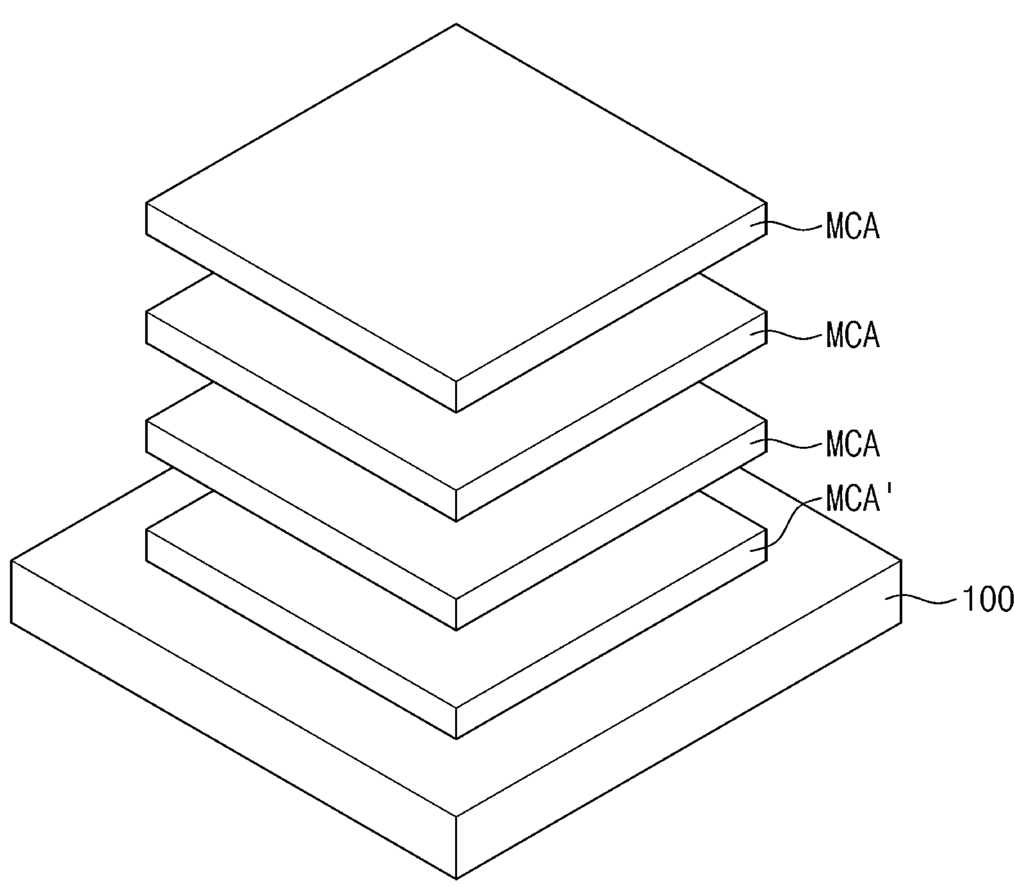
FIG. 1 is a conceptual diagram of a semiconductor device according to an embodiment of the present inventive concept.

FIG. 1 is a conceptual diagram of a semiconductor device according to an embodiment of the present inventive concept.

Referring to FIG. 1, a semiconductor device according to some embodiments of the present inventive concept may include a plurality of memory cell stacks MCA' and MCA sequentially stacked on a substrate 100. Each of the memory cell stacks MCA' and MCA may include a plurality of memory cells arranged two-dimensionally. The semiconductor device may be disposed between the memory cell stacks MCA' and MCA and include a plurality of conductive lines for writing, reading, and erasing the memory cells. Although four memory cell stacks MCA' and MCA are shown in FIG. 1, embodiments of the present inventive concept are not necessarily limited thereto and the number of the memory cell stacks MCA' and MCA may vary.

Figure 2:
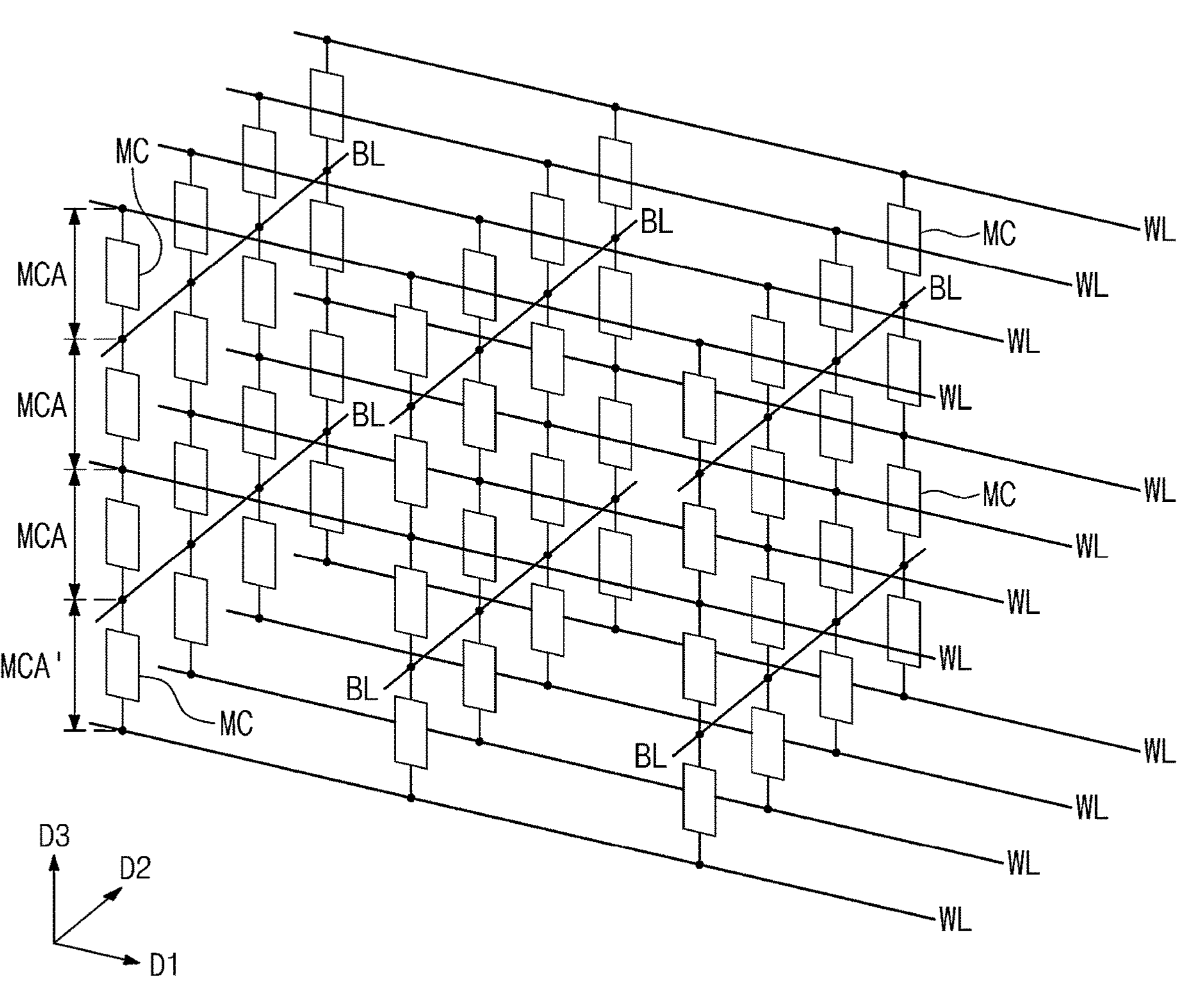
FIG. 2 is a circuit diagram for illustrating the memory cell stacks of FIG. 1 according to an embodiment of the present inventive concept.

FIG. 2 is a circuit diagram for illustrating the memory cell stacks of FIG. 1.

Referring to FIG. 2, a word line WL may extend in a first direction D1. In an embodiment, a plurality of word lines WL may be provided. The word lines WL may be adjacent to each other in a second direction D2 and a third direction D3. The first direction D1 and the second direction D2 may be parallel to a lower surface of the substrate 100 shown in FIG. 1 and may intersect each other. For example, in an embodiment, the first and second directions D1, D2 may be perpendicular to each other. However, embodiments of the present inventive concept are not necessarily limited thereto. The third direction D3 may be perpendicular to the lower surface of the substrate 100 and may be perpendicular to the first and second directions D1, D2.

The bit line BL may extend in the second direction D2 on the word line WL. For example, the bit line BL may extend in the second direction D2 between word lines WL adjacent to each other in the third direction D3. In an embodiment, a plurality of bit lines BL may be provided. The bit lines BL may be adjacent to each other in the first direction D1 and the third direction D3.

A memory cell stack MCA' and MCA may be interposed between the word line WL and the bit line BL. In an embodiment, a plurality of memory cell stacks MCA' and MCA may be provided. The memory cell stacks MCA' and MCA may be adjacent to each other in the third direction D3. The memory cell stacks MCA' and MCA adjacent to each other in the third direction D3 may share the word line WL or the bit line BL.

Each of the memory cell stacks MCA' and MCA may include a plurality of memory cells MC. Within one memory cell stack MCA' and MCA, memory cells MC may be adjacent to each other in the first and second directions D1 and D2. In an embodiment, by adjusting voltages of the word line WL and the bit line BL, data may be written, read, and erased from a specific memory cell MC in the specific memory cell stack MCA' or MCA.

Figure 3:
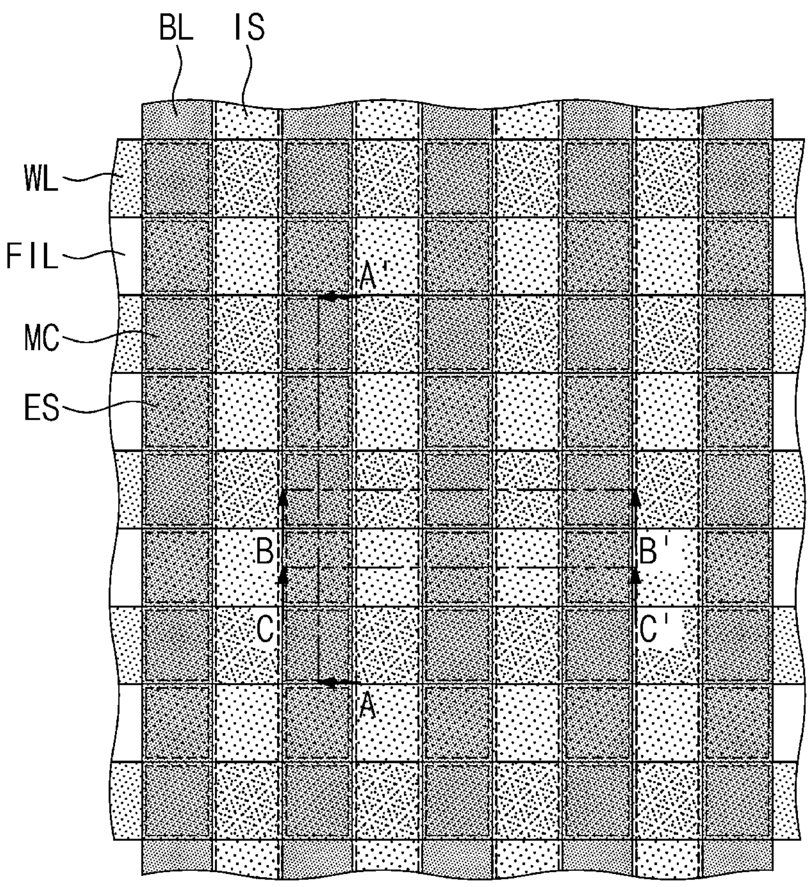
FIG. 3 is a plan view of a semiconductor device according to an embodiment of the present inventive concept.
Figure 3:
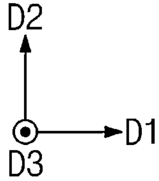
Figure 4A:
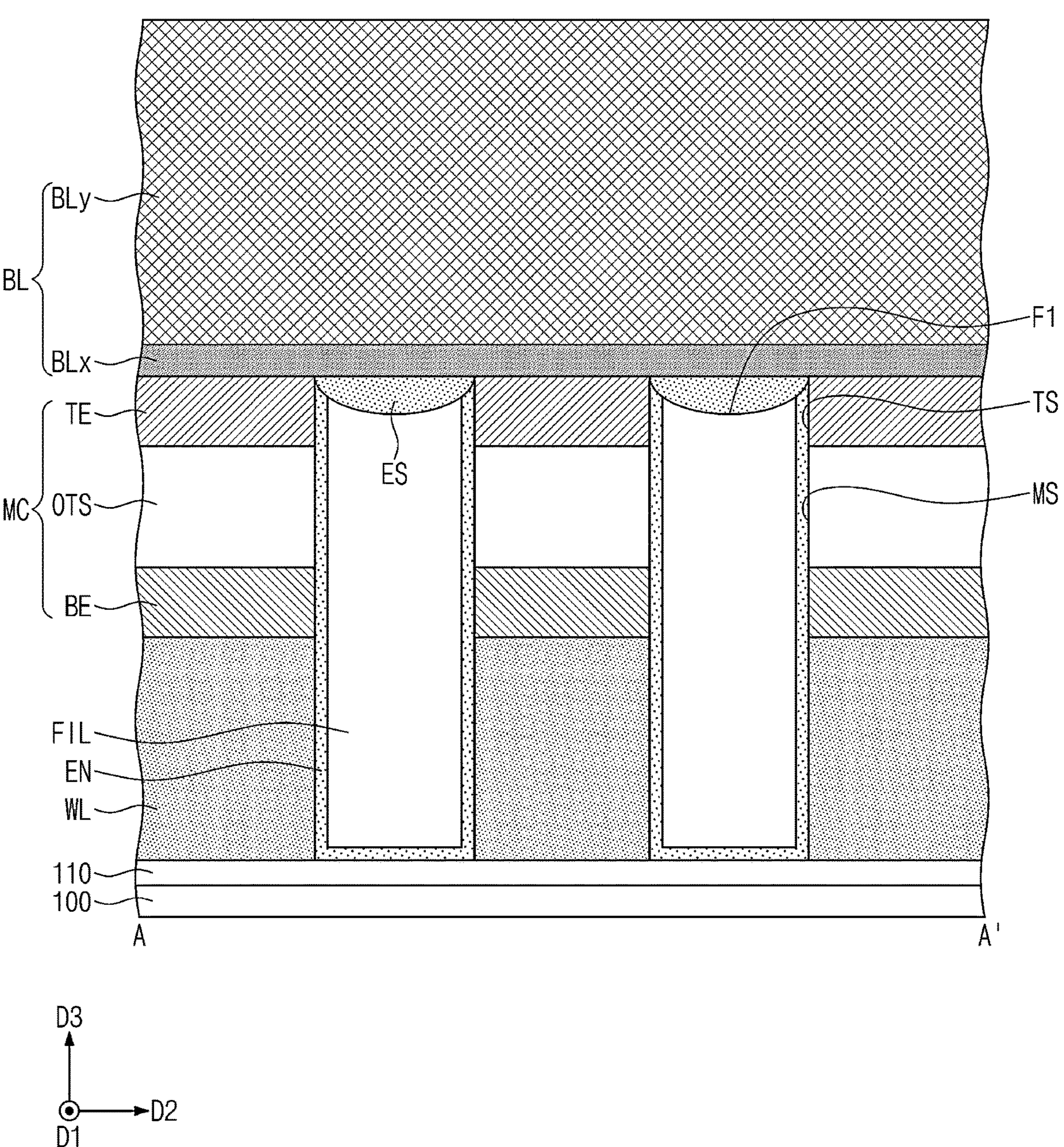
FIGS. 4A to 4C are cross-sectional views corresponding to lines A-A', B-B', and C-C' of FIG. 3, respectively, according to some embodiments of the present inventive concept.
Figure 4B:
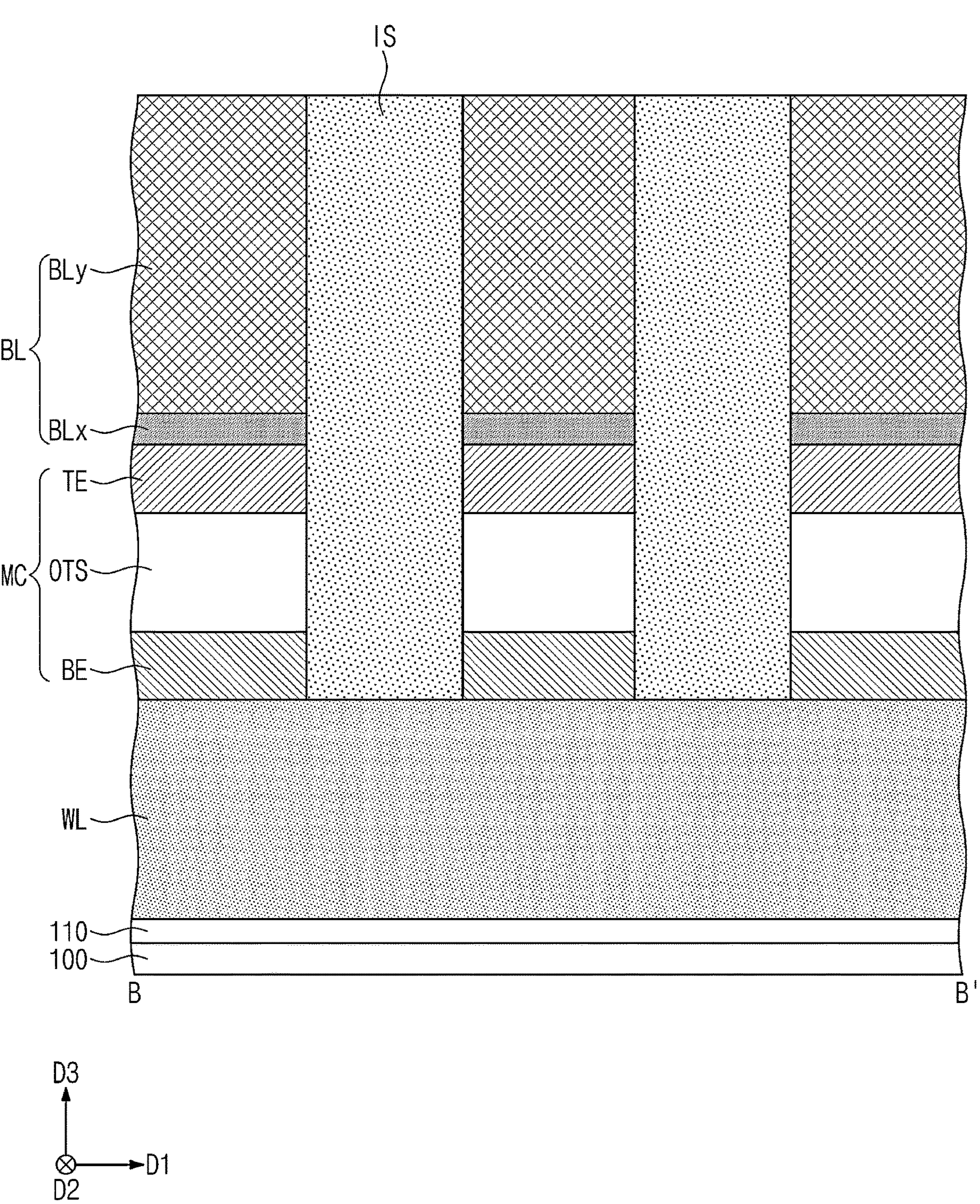
Figure 4C:
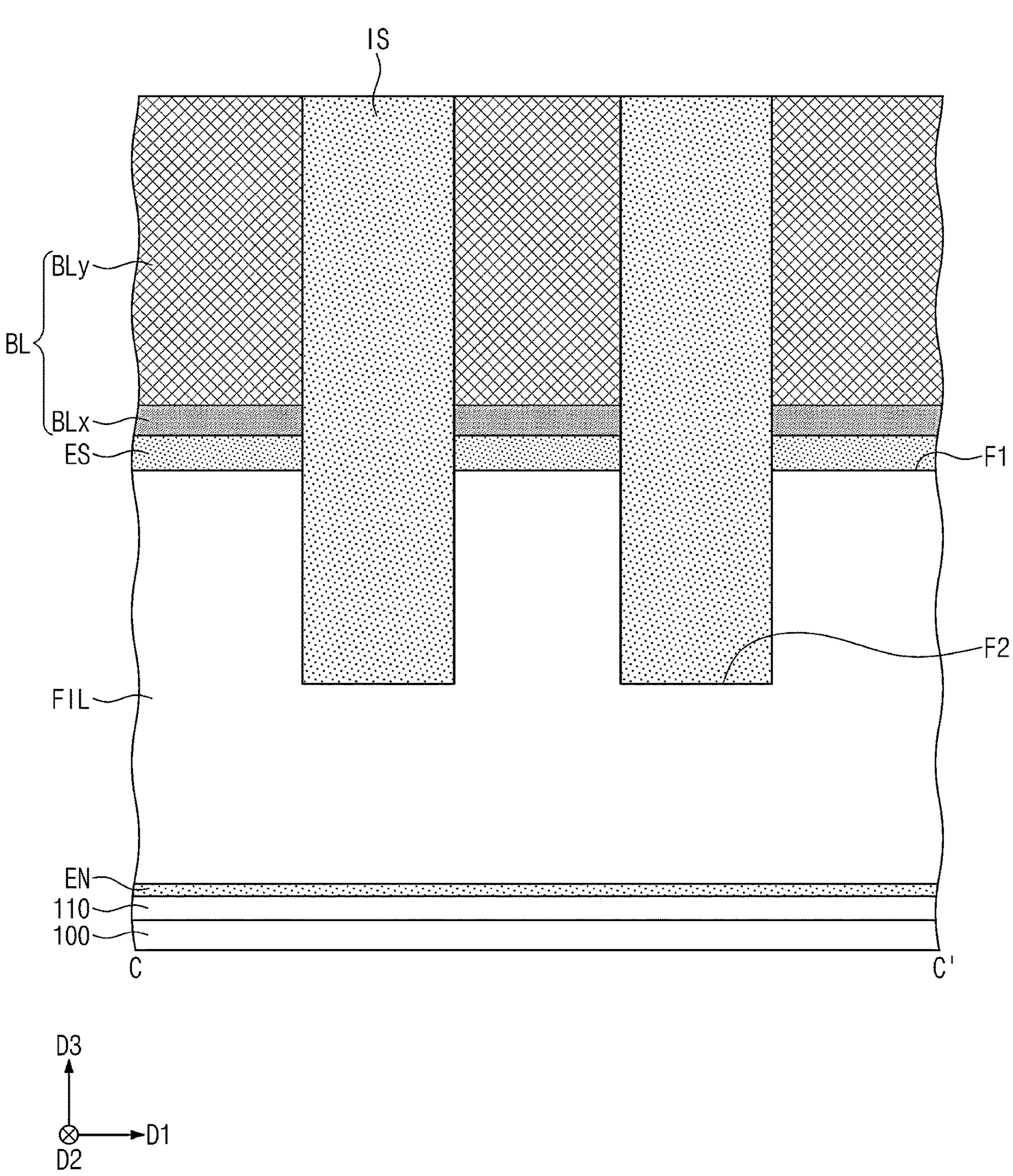

FIG. 3 is a plan view of a semiconductor device according to an embodiment of the present inventive concept. FIGS. 4A to 4C are cross-sectional views corresponding to lines A-A', B-B', and C-C' of FIG. 3, respectively according to some embodiments of the present inventive concept.

In an embodiment, a semiconductor device described with reference to FIGS. 3 and 4A to 4C may include memory cell stacks MCA' and MCA described with reference to FIGS. 1 and 2, word lines WL and bit lines BL described with reference to FIG. 2. Hereinafter, for convenience of explanation, the lowest memory cell stack MCA' and the adjacent word lines WL and bit lines BL will be described. However, embodiments of the present inventive concept are not necessarily limited thereto. The following description may be equally applied to other memory cell stacks MCA sequentially stacked on the lowest memory cell stack MCA'.

Referring to FIGS. 3 and 4A to 4C, the semiconductor device may include a substrate 100. For example, in an embodiment the substrate 100 may be a semiconductor substrate including a semiconductor material, such as a silicon single crystal substrate, a silicon-germanium substrate, or an SOI substrate.

An interlayer insulating layer 110 may be disposed on the substrate 100 (e.g., disposed directly thereon in the third direction D3). As an example, the interlayer insulating layer 110 may include at least one of silicon oxide, silicon nitride, and silicon oxynitride. In an embodiment, an upper surface of the interlayer insulating layer 110 may be recessed under a filling pattern FIL, which will be described later.

The word line WL may extend in the first direction D1 on the interlayer insulating layer 110. In an embodiment, a plurality of word lines WL may be provided. The word lines WL may be adjacent to each other in the second direction D2. The word line WL may include a conductive material.

The bit line BL may extend in the second direction D2 on the word line WL. For example, the bit line BL may extend in the second direction D2 on the word lines WL arranged in the second direction D2. In an embodiment, a plurality of bit lines BL may be provided. The bit lines BL may be adjacent to each other in the first direction D1.

The bit line BL may be a composite layer containing two or more materials. As an example, the bit line BL may include a lower bit line BLx and an upper bit line BLy. In an embodiment, the lower bit line BLx may be interposed between the upper bit line Bly and an upper electrode TE (e.g., in the third direction D3), which will be described later.

In an embodiment, the lower bit line BLx may include a material that prevents diffusion of the upper bit line BLy material. For example, in some embodiments the lower bit line BLx may include metal nitride (e.g., nitride such as Ti, Mo, W, Cu, Al, Ta, Ru, Ir, Co, etc.). As an example, the upper bit line BLy may include a conductive material.

A memory cell MC may be interposed between the word line WL and the bit line BL (e.g., in the third direction D3). When viewed in a plan view, the memory cell MC may be disposed in a region where the word line WL and the bit line BL overlap each other (e.g., in the third direction D3). In other words, when viewed in a two-dimensional perspective, the memory cell MC may be positioned at an intersection of the word line WL and the bit line BL. In an embodiment, a plurality of memory cells MC may be provided. The memory cells MC may be adjacent to each other in the first direction D1 and the second direction D2. Each of the memory cells MC adjacent to each other in the first direction D1 may be disposed on an upper surface of one word line WL (e.g., a same word line WL) extending in the first direction D1. Each of the memory cells MC adjacent to each other in the second direction D2 may be disposed on a lower surface of one bit line BL (e.g., a same bit line BL) extending in the second direction D2.

In an embodiment, the memory cell MC may include a lower electrode BE, a selection element OTS, and an upper electrode TE that are sequentially stacked on the word line WL (e.g., in the third direction D3). The lower electrode BE, the selection element OTS, and the upper electrode TE may vertically overlap each other (e.g., in the third direction D3). In an embodiment, the lower electrode BE may be in direct contact with the selection element OTS. The upper electrode TE may be in direct contact with an upper surface of the selection element OTS and a lower surface of the lower bit line BLx.

Each of the lower electrode BE and the upper electrode TE may include a conductive material. For example, in an embodiment each of the lower electrode BE and the upper electrode TE may include carbon (C).

The selection element OTS may have both selector and memory characteristics. First, the selection element OTS may function as a selector by having a threshold voltage.

In addition, the selection element OTS may function as a memory by changing the threshold voltage depending on an operation state. The operation state of the selection element OTS may mean a set operation or a reset operation. In an embodiment, the set operation may be defined as a series of operations that cause the selection element OTS to have data of “1”. The reset operation may be defined as a series of operations that cause the selection element OTS to have data of “0”. The threshold voltage of the selection element OTS in the set state may be different from the threshold voltage of the selection element OTS in the reset state, and accordingly, the selection element OTS may be used as a memory.

The selection element OTS may include a chalcogenide-based material. In an embodiment, the selection element OTS may include at least one of GeSe, GeS, AsSe, AsTe, AsS SiTe, SiSe, SiS, GeAs, SiAs, SnSe, and SnTe. In an embodiment, the selection element OTS may include at least one of GeAsTe, GeAsSe, AlAsTe, AlAsSe, SiAsSe, SiAsTe, GeSeTe, GeSeSb, GaAsSe, GaAsTe, InAsSe, InAsTe, SnAsSe, and SnAsTe. In an embodiment, the selection element OTS may include at least one of GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeln, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, and GeAsTeZn. In an embodiment, the selection element OTS may include at least one of GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, Ge AsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, and GeAsSeZnSn. In an embodiment, the selection element OTS may include at least one of GeSiAsSeTeS, GeSiAsSeTeIn, GeSiAsSeGa, GeSiAsSeAl, GeSiAsSeTeTl, GeSiAsSeTeZn, GeSiAsSeTeSn, GeSiAsSeTeP, GeSiAsSeSIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSePIn, GeAsSeTePGa, GeAsSeTePAl, GeAsSePTl, GeAsSeTePZn, GeAsSePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn, and GeAsSeSAlSn.

A filling pattern FIL may be interposed between the word lines WL (e.g., in the second direction D2). The filling pattern FIL may be disposed on a side surface MS of the memory cell MC. The side surface MS may be a side facing the second direction D2 or a direction opposite to the second direction D2. The filling pattern FIL may be interposed between adjacent memory cells MC in the second direction D2. As an example, the filling pattern FIL may extend in the third direction D3 between memory cells MC adjacent to each other in the second direction D2 (refer to FIG. 4A). As an example, the filling pattern FIL may extend in the first direction D1 on a side surface of the word line WL (refer to FIG. 4C). In an embodiment, a plurality of filling patterns FIL may be provided. The filling patterns FIL may be adjacent to each other in the second direction D2. As an example, the filling pattern FIL may include a low dielectric material (e.g., a low-k material). Herein, the low dielectric material refers to a material having a lower dielectric constant than silicon oxide. As an example, in an embodiment the filling pattern FIL may include SiOC. However, embodiments of the present inventive concept are not necessarily limited thereto.

The filling pattern FIL may have upper surfaces positioned at different levels from each other. In an embodiment, the filling pattern FIL may have a first upper surface F1 under the bit line BL and a second upper surface F2 under an insulating pattern IS (refer to FIG. 4C), which will be described later. The first upper surface F1 of the filling pattern FIL may be positioned at a higher level than the second upper surface F2 thereof. For example, the first upper surface F1 may be positioned farther from the substrate 100 in the third direction D3 than the second upper surface F2. Accordingly, in an embodiment the upper surface of the filling pattern FIL may have a concavo-convex structure as the filling pattern FIL moves in the first direction D1.

The filling pattern FIL may extend in the third direction D3 along a side surface TS of the upper electrode TE, and accordingly, the first upper surface F1 of the filling pattern FIL may be positioned at a higher level than a lower surface of the upper electrode TE (refer to FIG. 4A). For example, the first upper surface F1 may be positioned farther from the substrate 100 in the third direction D3 than the lower surface of the upper electrode TE. The first upper surface F1 of the filling pattern FIL may be positioned at a lower level than the lower surface of the lower bit line BLx.

In an embodiment, a protective layer EN may be interposed between the filling pattern FIL and the memory cell MC, between the filling pattern FIL and the word line WL, and between the filling pattern FIL and the interlayer insulating layer 110. As an example, the protective layer EN may sequentially extend from a space between the filling pattern FIL and the memory cell MC, into a space between the filling pattern FIL and the word line WL, and into a space between the filling pattern FIL and the interlayer insulating layer 110. For example, when viewed in a cross-sectional view, the protective layer EN may conformally cover side and bottom surfaces of the filling pattern FIL. The protective layer EN may include an insulating material. For example, in an embodiment the protective layer EN may include silicon nitride (SiN).

An etch stop pattern ES may be interposed between the filling pattern FIL and the bit line BL. In detail, the etch stop pattern ES may be interposed between a first upper surface F1 of the filling pattern FIL and the bit line BL (e.g., in the third direction D3). The etch stop pattern ES may be disposed directly on the first upper surface F1 of the filling pattern FIL. The etch stop pattern ES may be disposed on the side surface TS of the upper electrode TE. As an example, the etch stop pattern ES may be interposed between adjacent upper electrodes TE in the second direction D2. A lower surface of the etch stop pattern ES may be positioned at a higher level (e.g., in the third direction D3) than the lower surface of the upper electrode TE. In an embodiment, a plurality of etch stop patterns ES may be provided. The etch stop patterns ES may be adjacent to each other in the first and second directions D1 and D2.

The etch stop pattern ES may include an insulating material. For example, the etch stop pattern ES may include a material having a slower etch-rate than the filling pattern FIL with respect to an etchant used in the bit line BL formation process. In an embodiment, the etchant may include, but is not necessarily limited thereto, at least some of the materials commonly used to etch materials constituting the bit line BL (e.g., tungsten (W)). As an example, the etch stop pattern ES may include silicon nitride (SiN).

The insulating pattern IS may be interposed between the bit lines BL. The insulating pattern IS may extend in the second direction D2 along with the bit line BL. In an embodiment, the insulating pattern IS may extend further than the bit lines BL in a direction opposite to the third direction D3 between the bit lines BL. The insulating pattern IS may cover a portion of an upper surface of the word line WL and the second upper surface F2 of the filling pattern FIL. In an embodiment, a plurality of insulating patterns IS may be provided. The insulating patterns IS may be adjacent to each other in the first direction D1. The insulating pattern IS may include an insulating material.

FIGS. 3 and 4A to 4C illustrate only the lowest memory cell stack MCA', word lines WL and bit lines BL which are adjacent to the memory cell stack MCA' shown in FIGS. 1 and 2. However, embodiments of the present inventive concept are not necessarily limited thereto. As an example, in some embodiments the word lines WL and the bit lines BL may be further alternately arranged in the third direction D3 on the bit lines BL described with reference to FIGS. 4A to 4C. In this embodiment, as shown in FIG. 2, each of the plurality of memory cell stacks MCA may be further interposed between the word lines WL and the bit lines BL adjacent to each other in the third direction D3. The characteristics of each of the plurality of memory cell stacks MCA may be the same/similar to the characteristics of the lowest memory cell stack MCA'. In addition, a relationship between the lowest memory cell stack MCA' and surrounding components (e.g., etch stop pattern ES, filling pattern FIL, etc.) may be equally/similarly applied to each of the plurality of memory cell stacks MCA.

Figure 5:
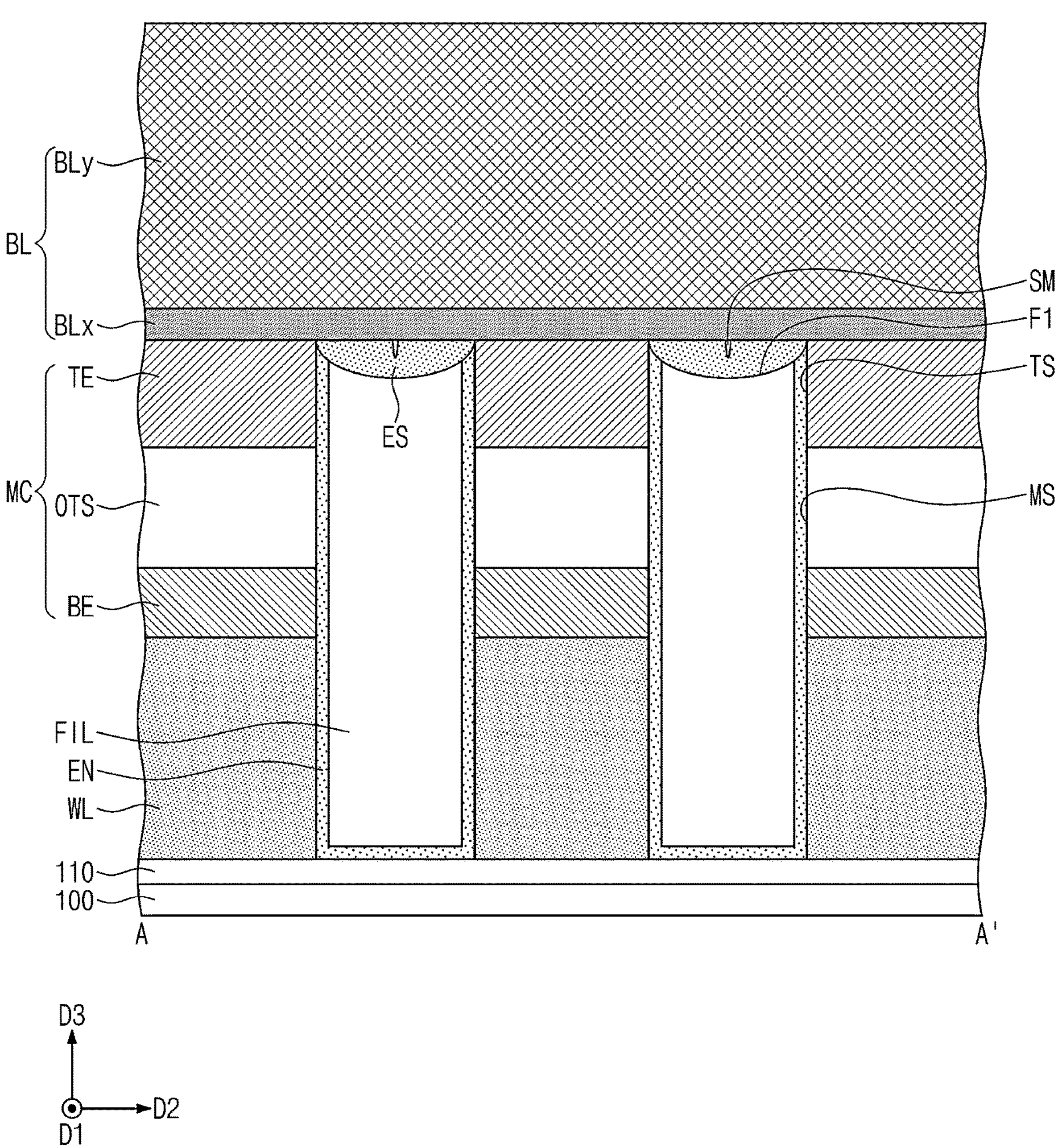
FIG. 5 is a cross-sectional view corresponding to line A-A' in FIG. 3 according to an embodiment of the present inventive concept.

FIG. 5 is a cross-sectional view of a semiconductor device according to an embodiment of the present inventive concept. In detail, FIG. 5 is a cross-sectional view corresponding to line A-A' in FIG. 3. To simplify the explanation, description of content that overlaps with the above-described content may be omitted, and the explanation will focus on the differences from the above-described content.

Referring to FIG. 5, at least one of the etch stop patterns ES may include a seam SM therein. The seam SM may or may not be provided depending on a manufacturing process described later. In an embodiment, the seam SM may be a kind of boundary formed by depositing and meeting the etch stop pattern ES from both inner surfaces of a recess region RS, which will be described later. As an example, in an embodiment the seam SM may include an empty space. However, embodiments of the present inventive concept are not necessarily limited thereto and the shape, location, and number of seam SM may be variously changed.

Hereinafter, a method of manufacturing a semiconductor device according to some embodiments of the present inventive concept will be described with reference to FIGS. 6 to 12. To simplify the explanation, a description of content that overlaps with the above-described content may be omitted, and the explanation will focus on the differences from the above-described content.

Figure 6:
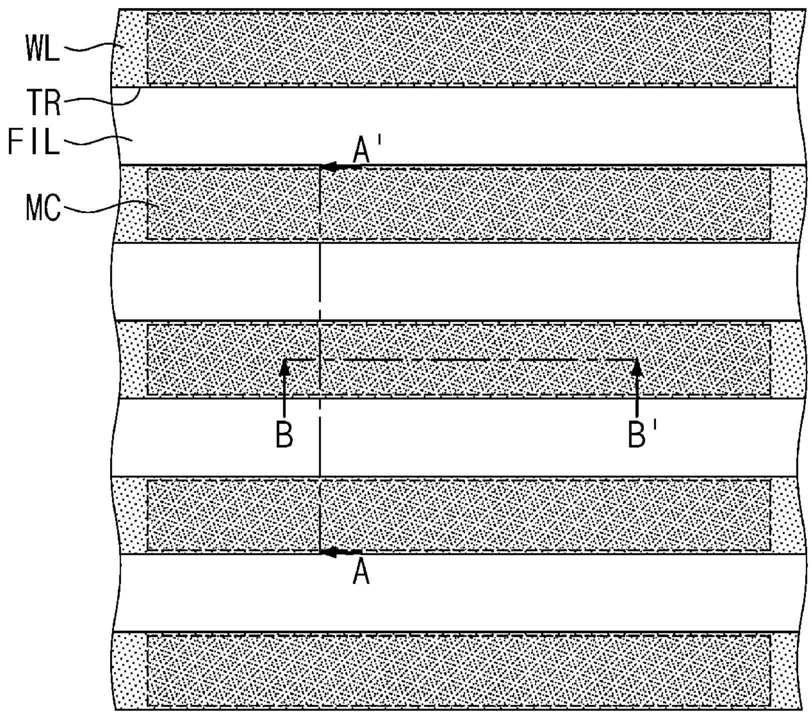
FIG. 6 is a plan view illustrating a method of manufacturing a semiconductor device according to an embodiment of the present inventive concept.
Figure 6:
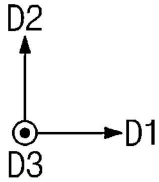
Figure 7A:
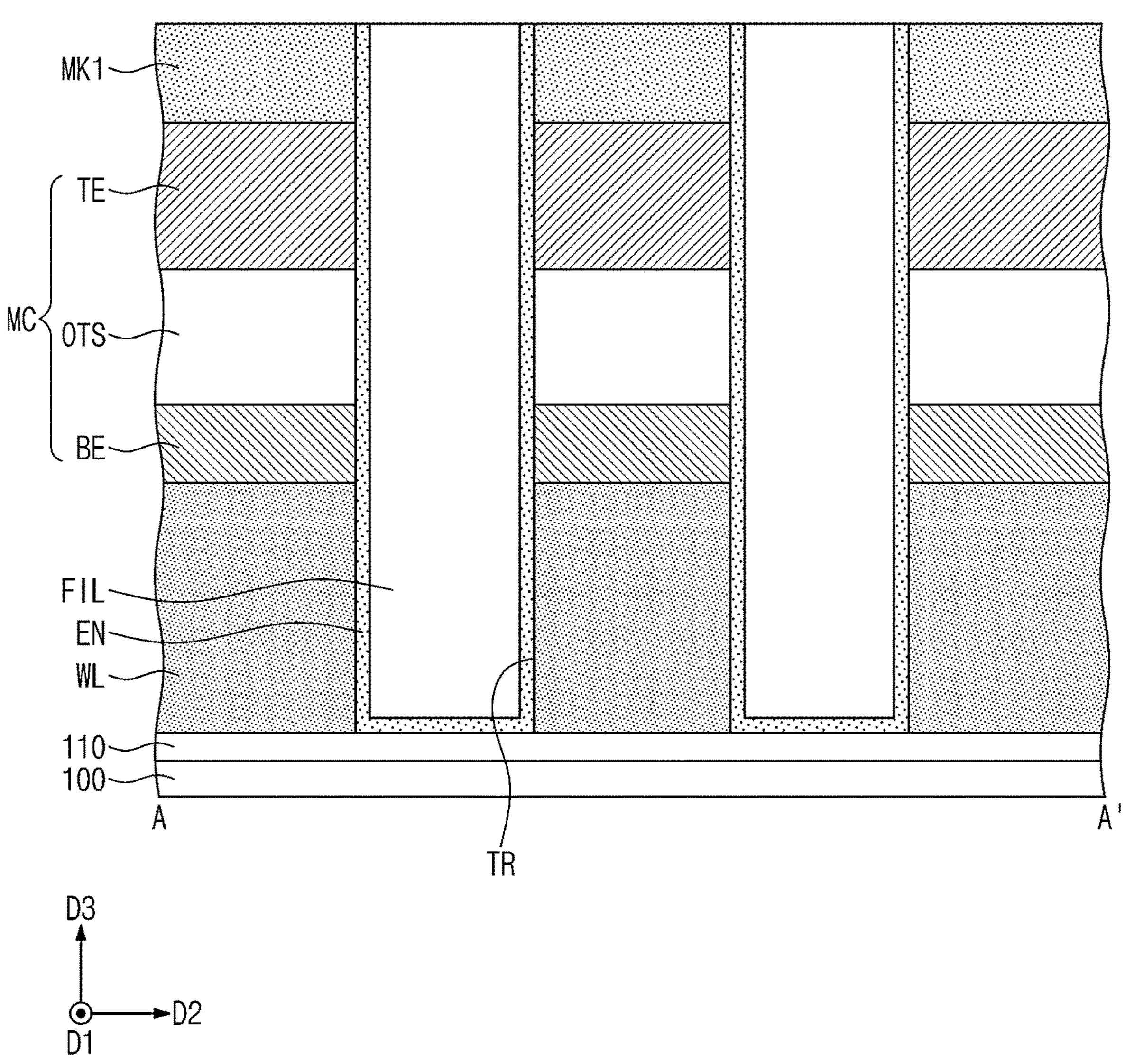
FIGS. 7A and 7B are cross-sectional views corresponding to lines A-A' and B-B' of FIG. 6, respectively according to some embodiments of the present inventive concept.
Figure 7B:
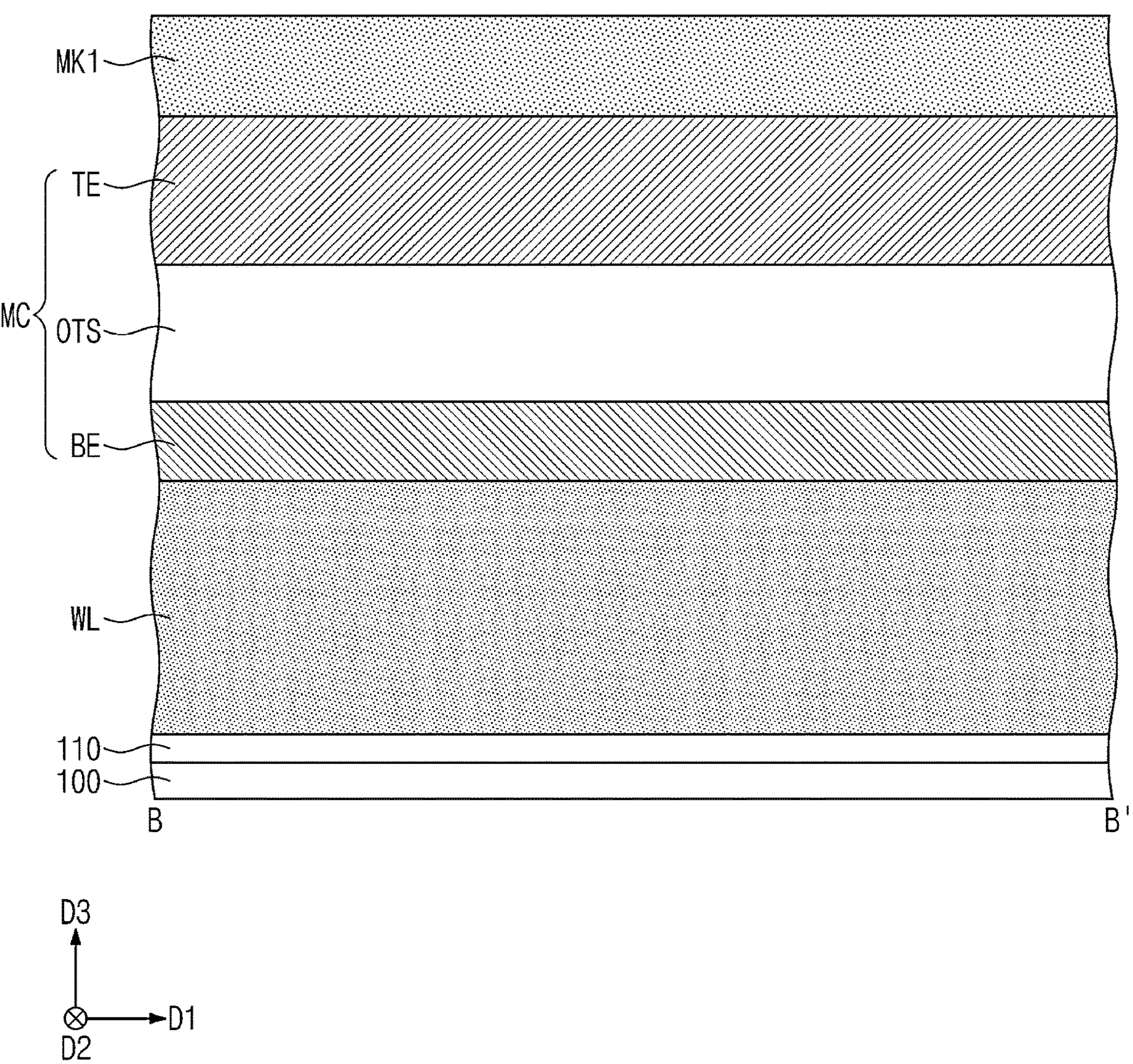
Figure 8:
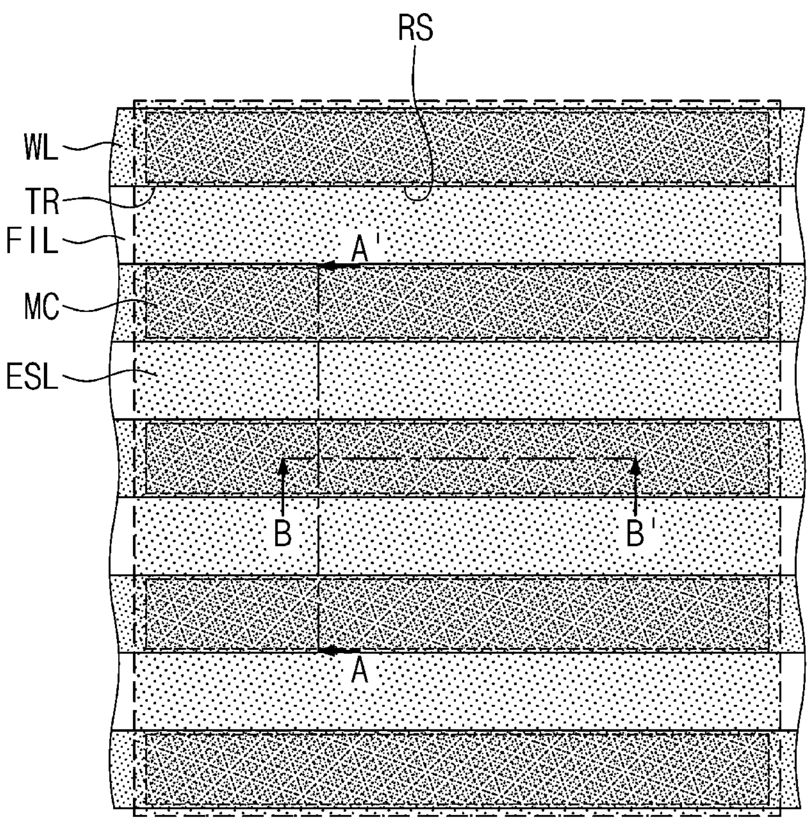
FIG. 8 is a plan view illustrating a method of manufacturing a semiconductor device according to an embodiment of the present inventive concept.
Figure 8:
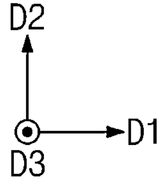
Figure 9A:
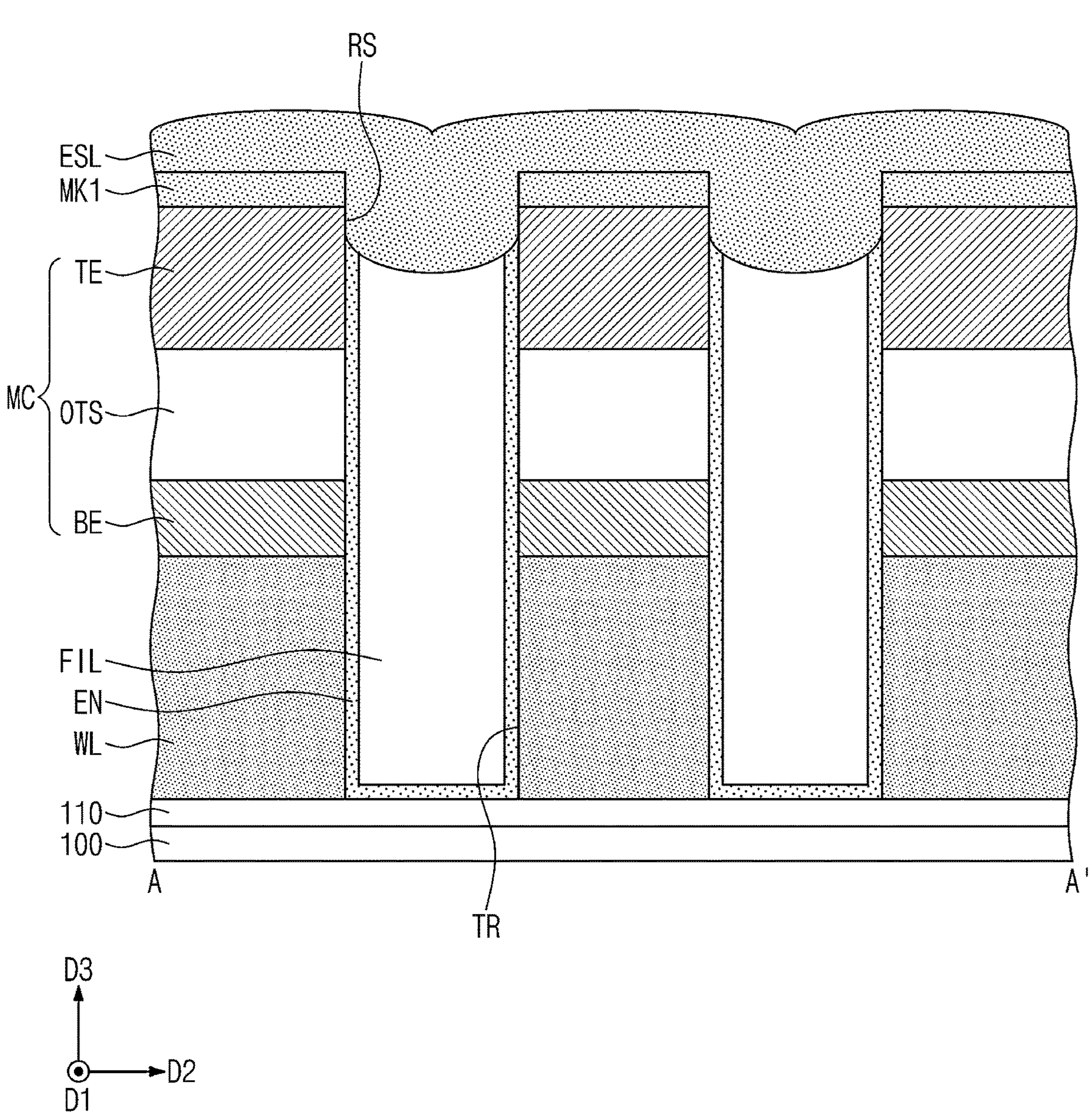
FIGS. 9A and 9B are cross-sectional views corresponding to lines A-A' and B-B' of FIG. 8, respectively according to some embodiments of the present inventive concept.
Figure 9B:
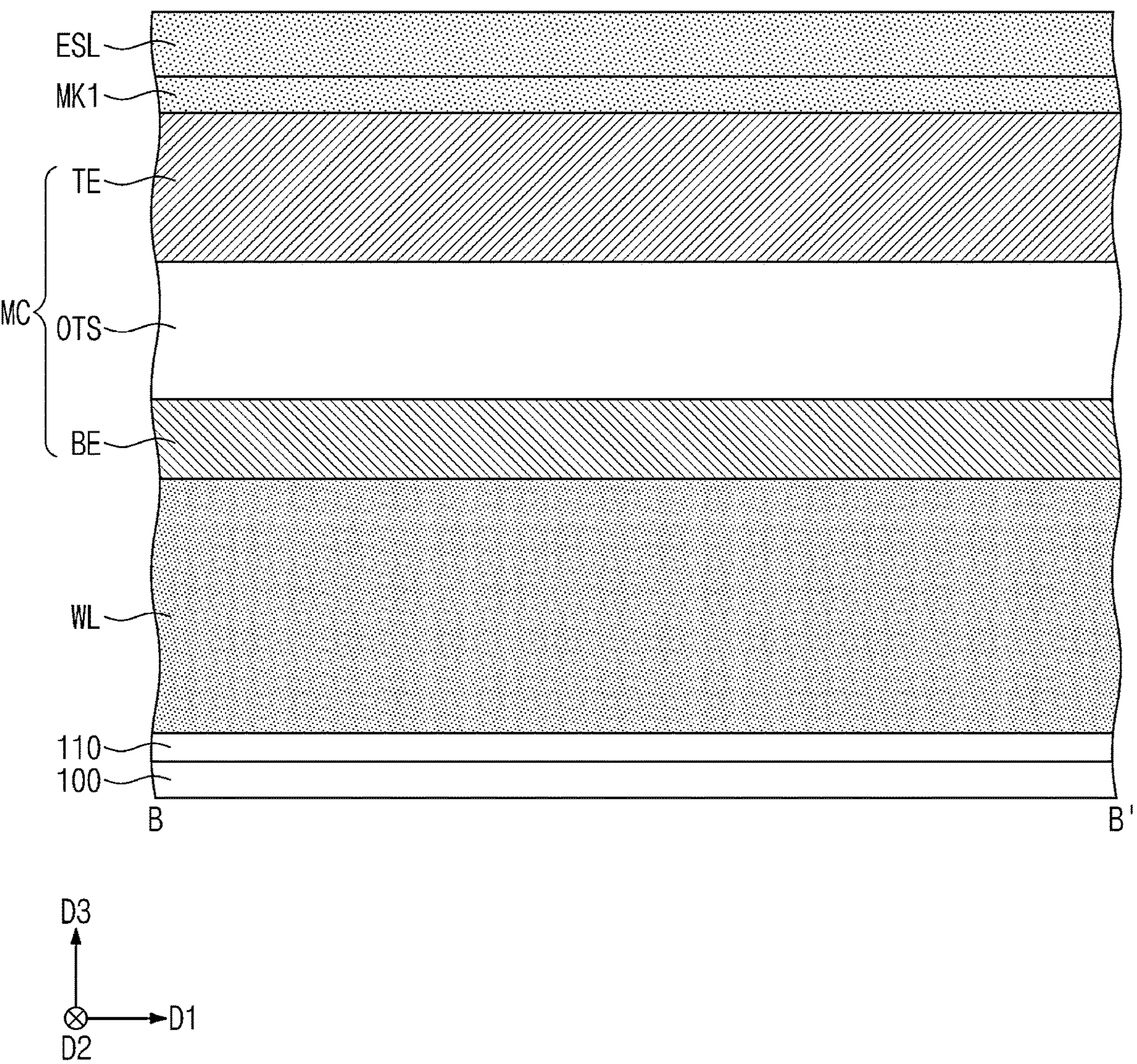
Figure 10:
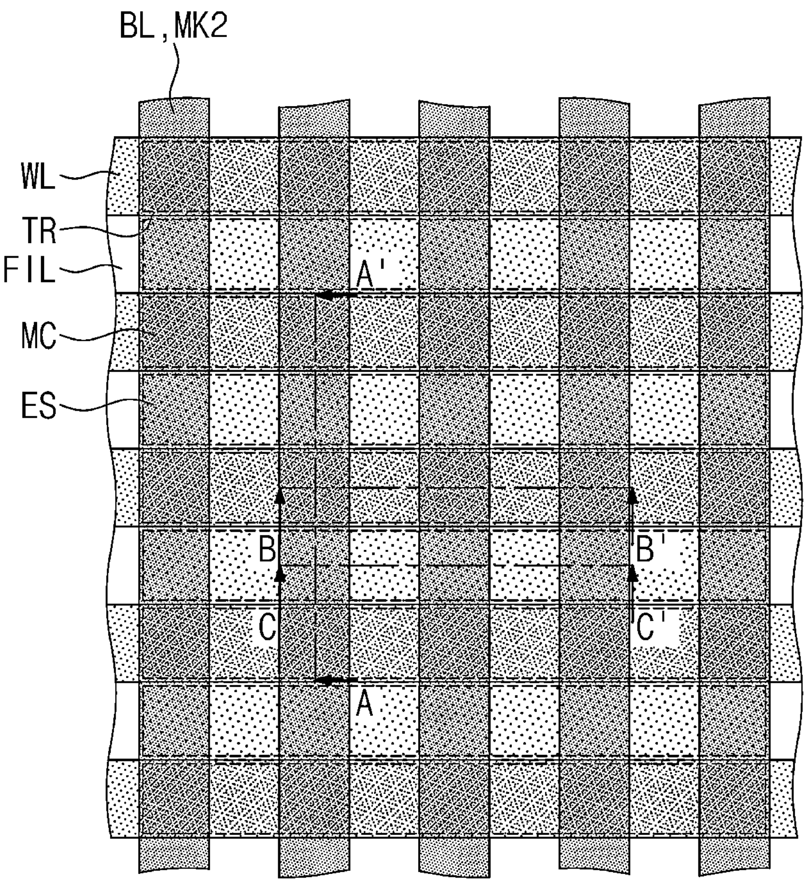
FIG. 10 is a plan view illustrating a method of manufacturing a semiconductor device according to an embodiment of the present inventive concept.
Figure 10:
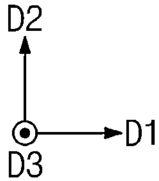
Figure 11A:
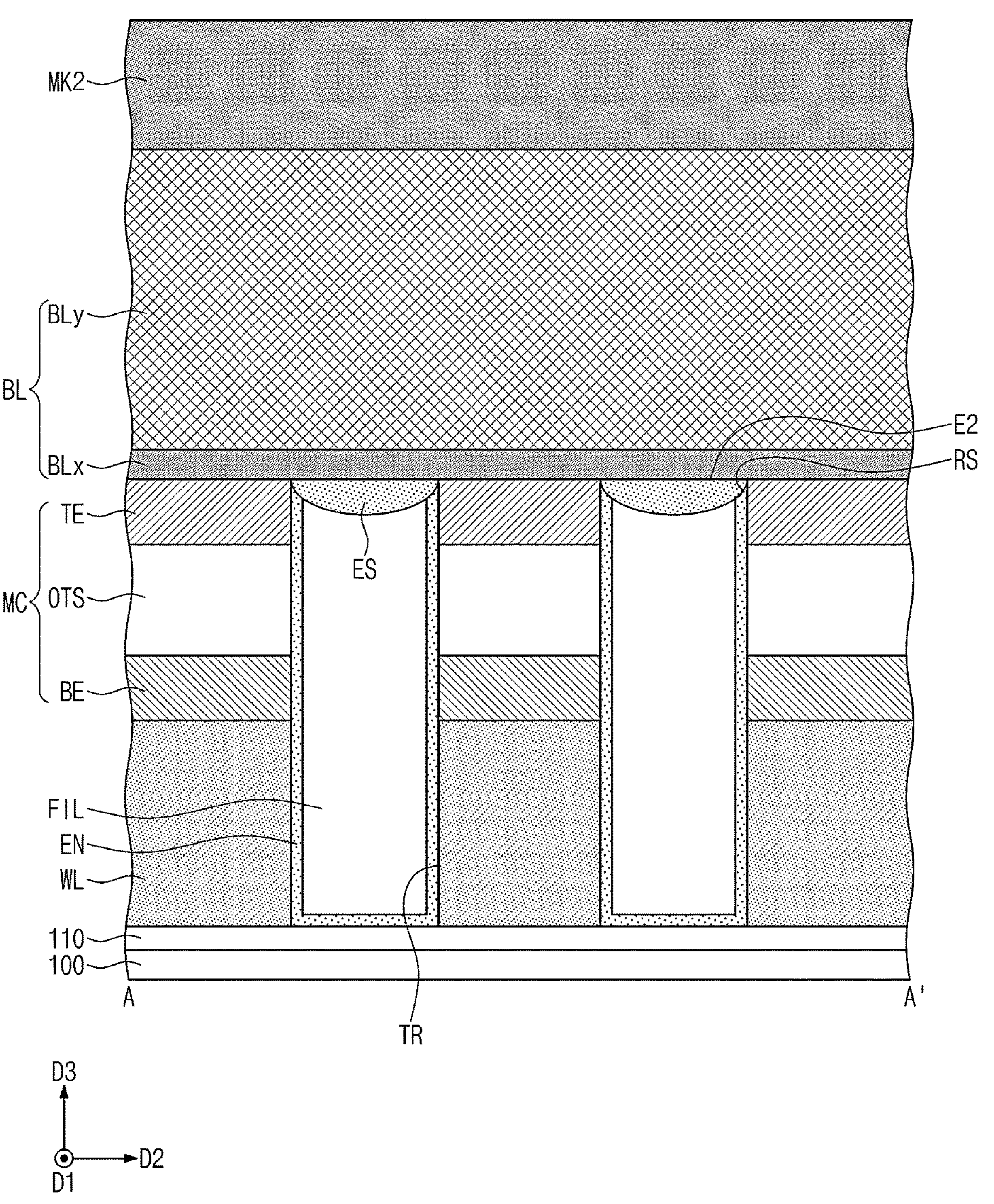
FIGS. 11A to 11C are cross-sectional views corresponding to lines A-A', B-B', and C-C' of FIG. 10, respectively, according to some embodiments of the present inventive concept.
Figure 11B:
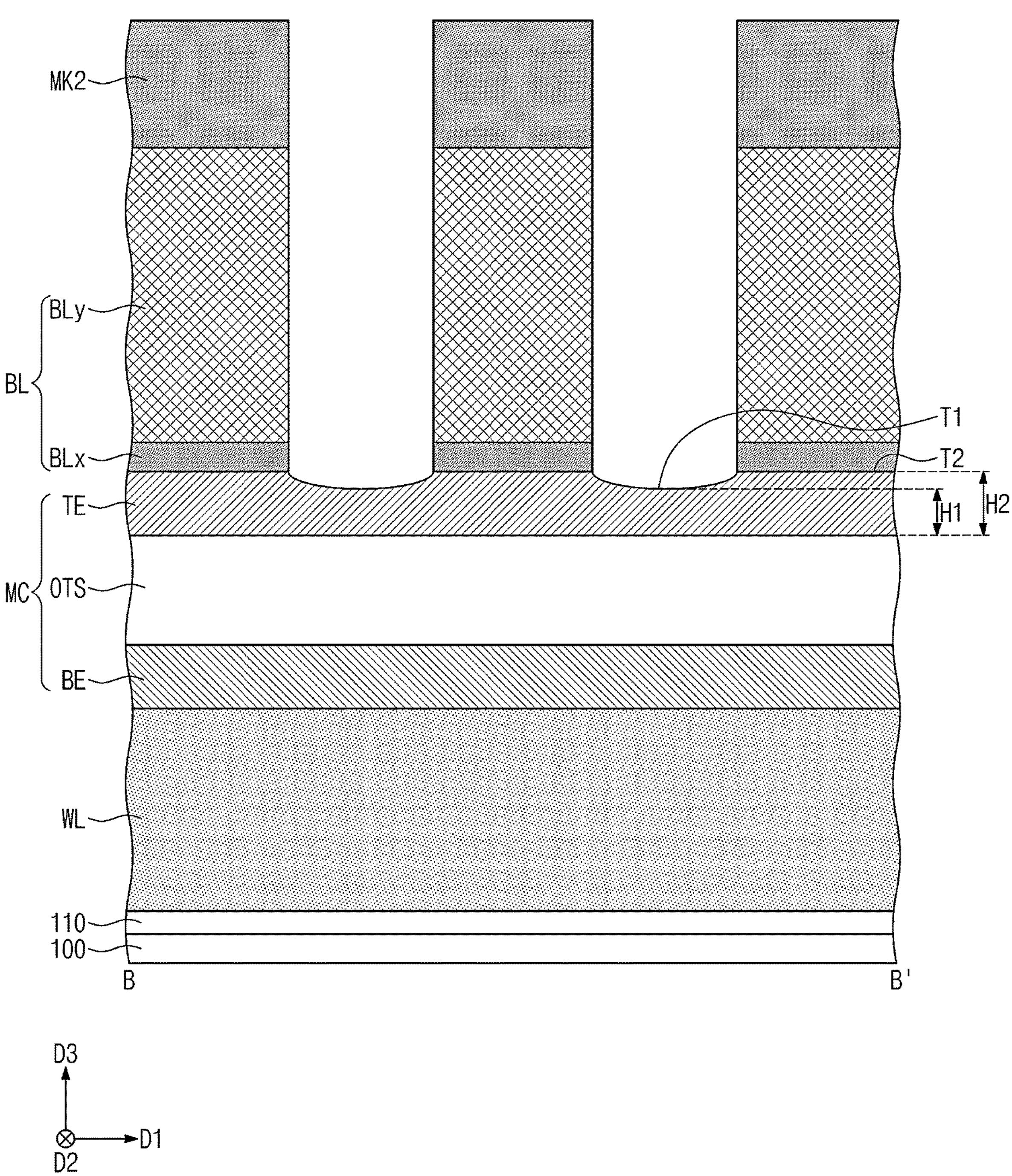

FIGS. 6, 8, and 10 are plan views illustrating a method of manufacturing a semiconductor device according to some embodiments of the present inventive concept, respectively. FIGS. 7A, 9A, and 11A are cross-sectional views corresponding to line A-A' of FIGS. 6, 8, and 10, respectively. FIGS. 7B, 9B, and 11B are cross-sectional views corresponding to line B-B' of FIGS. 6, 8, and 10, respectively.

Referring to FIGS. 6, 7A, and 7B, the substrate 100 may be provided. The interlayer insulating layer 110 may be formed on (e.g., formed directly thereon in the third direction D3) the entire surface of the substrate 100.

In an embodiment, the word line WL, the lower electrode BE, the selection element OTS, and the upper electrode TE may be formed to be sequentially stacked on the interlayer insulating layer 110 (e.g., in the third direction D3). The lower electrode BE, selection element OTS, and upper electrode TE may form the memory cell MC. A first mask pattern MK1 may be formed to extend in the first direction D1 on the upper electrode TE (e.g., directly thereon in the third direction D3). In an embodiment, a plurality of first mask patterns MK1 may be provided. The first mask patterns MK1 may be spaced apart from each other in the second direction D2. The first mask pattern MK1 may be a single layer or a composite layer. For example, in an embodiment the first mask pattern MK1 may be a composite layer including silicon nitride (SiN) and silicon oxide (SiO2).

A removal process for each of the word line WL and the memory cell MC may be performed using the first mask patterns MK1 as an etch mask. Accordingly, each of the word line WL and the memory cell MC may extend in the first direction D1, and a plurality of word lines WL and a plurality of memory cells MC may be formed to be spaced apart from each other in the second direction D2. As an example, in an embodiment during the removal process, a portion of the interlayer insulating layer 110 may also be removed.

Through the removal process, a trench TR may be formed between adjacent word lines WL in the second direction D2, between memory cells MC adjacent to each other in the second direction D2, and the first mask patterns MK1 adjacent to each other in the second direction D2. A plurality of trenches TR may be formed. In an embodiment, the trenches TR may each extend in the first direction D1 and be spaced apart from each other in the second direction D2. For example, in an embodiment the trench TR may extend further into the interlayer insulating layer 110.

In an embodiment, the protective layers EN may conformally cover inner surfaces of the trenches TR. For example, the protective layers EN may be formed to conformally cover side surfaces (e.g., lateral side surfaces) of each of the word line WL, memory cell MC, and first mask pattern MK1 and a portion of an upper surface of the interlayer insulating layer 110. Thereafter, the filling patterns FIL may be formed to fill the remainder of the trenches TR.

Referring to FIGS. 8, 9A, and 9B, recess regions RS may be formed on the filling patterns FIL, such as an upper portion of the filling patterns FIL. In an embodiment, the recess region RS may be defined between adjacent ones of the first mask patterns MK1 and portions of adjacent ones of the upper electrodes TE. Each of the recess regions RS may extend in the first direction D1. The recess regions RS may be adjacent to each other in the second direction D2. In an embodiment, when forming the recess region RS, upper portions of the first mask pattern MK1, protective layer EN, and filling pattern FIL may be removed together. Accordingly, a portion of the side surface of the upper electrode TE may be exposed to the outside. Thereafter, the etch stop layer ESL may be formed to fill the recess regions RS and cover the upper surfaces of the first mask patterns MK1.

Referring to FIGS. 10 and 11A to 11C, a removal process may be performed on a portion of the etch stop layer ESL. In an embodiment the removal process may separate the etch stop layer ESL into etch stop patterns ES that each extend in the first direction D1 and are spaced apart from each other in the second direction D2. Upper surfaces of the etch stop patterns ES may be exposed to the outside. In an embodiment, during the removal process, a portion of the upper electrodes TE and the first mask patterns MK1 may also be removed. Accordingly, upper surfaces of the upper electrodes TE may be exposed to the outside.

Thereafter, in an embodiment a lower bit line layer and an upper bit line layer may be formed to cover the exposed upper surfaces of the upper electrodes TE and the exposed upper surfaces of the etch stop patterns ES. In an embodiment, second mask patterns MK2 may be formed on the upper bit line layer. The second mask patterns MK2 may each extend in the second direction D2 and be spaced apart from each other in the first direction D1. For example, the second mask pattern MK2 may be a single layer or a composite layer. For example, in an embodiment the second mask pattern MK2 may include at least one of silicon nitride (SiN) and silicon oxide ($SiO2$).

In an embodiment, the removal process for the lower bit line layer and the upper bit line layer may be performed using the second mask patterns MK2 as an etch mask. In an embodiment, the remainder of the lower bit line layer may form a lower bit line BLx, and the remainder of the upper bit line layer may form an upper bit line BLy. The lower bit line BLx and the upper bit line BLy may constitute a bit line BL.

Figure 11C:
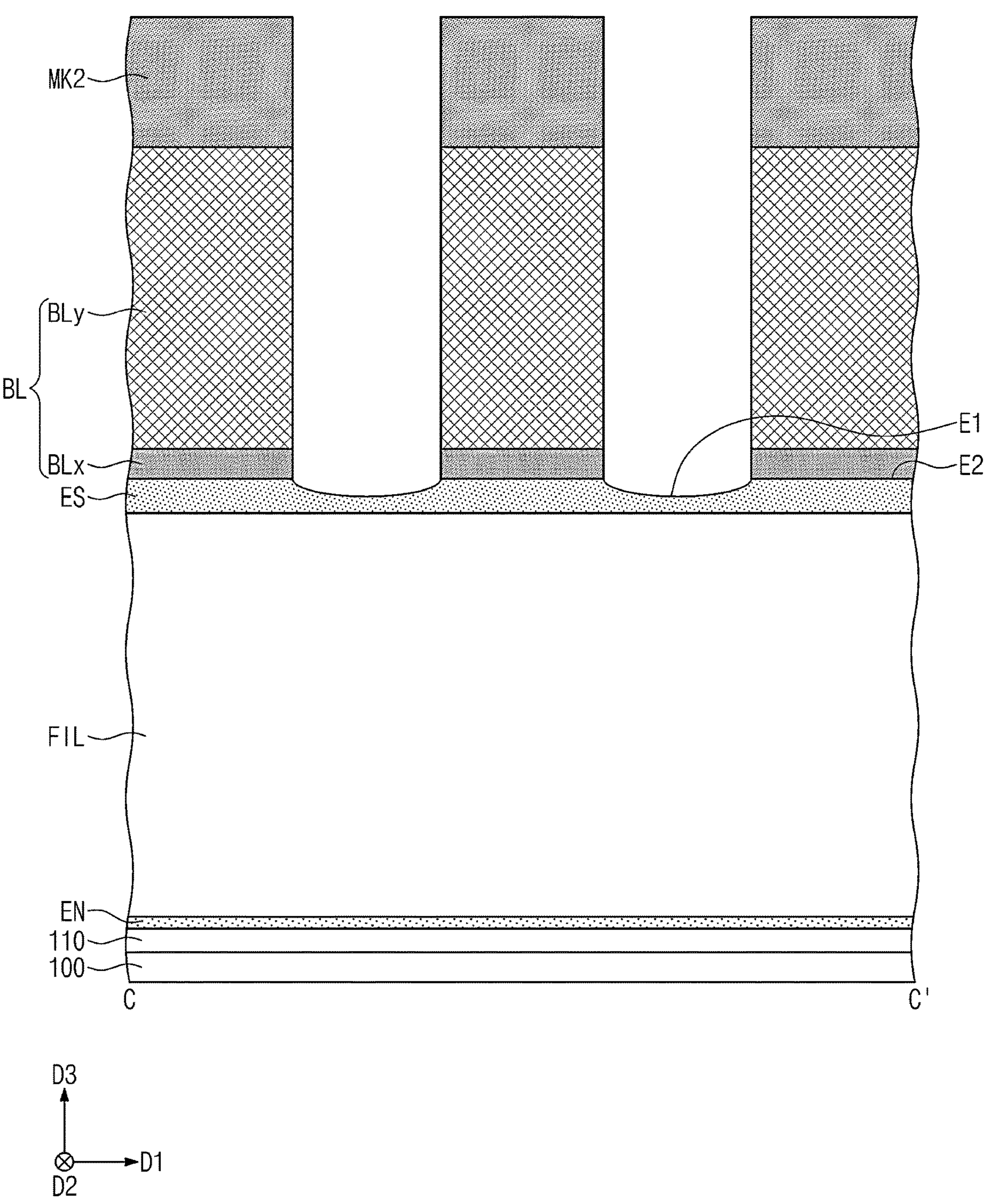

During the forming process of the bit line BL, a portion of an upper surface of the etch stop pattern ES and a portion of the upper surface of the upper electrode TE may be recessed and exposed to the outside. Accordingly, as shown in FIG. 11C the etch stop pattern ES may have an exposed first upper surface E1 and a second upper surface E2 below (e.g., directly therebelow) the bit line BL. As shown in FIG. 11B, the upper electrode TE may have an exposed first upper surface T1 and a second upper surface T2 below (e.g., directly therebelow) the bit line BL. The upper electrode TE may have a first height H1 (e.g., length in the third direction D3) between the lower surface of the upper electrode TE and the first upper surface T1 thereof and a second height H2 (e.g., length in the third direction D3) between the lower surface of the upper electrode TE and the second upper surface T2 thereof.

In an embodiment, during the forming process of the bit line BL, a depth of recess of the first upper surface T1 of the upper electrode TE may be variously changed depending on an etch-rate of a surround configuration (e.g., etch stop pattern ES) on a side surface of the upper electrode TE. The etch-rate may be an etch-rate for an etchant used in the bit line BL formation process. For example, as the etch-rate of the etch stop pattern ES is faster, the first upper surface E1 of the etch stop pattern ES may be further recessed, and accordingly, the first upper surface T1 of the upper electrode TE adjacent to the first upper surface E1 of the etch stop pattern ES in the second direction (D2) may be more affected by the etchant in the second direction D2, and be further recessed relatively. As another example, as the etch-rate of the etch stop pattern ES is slower, the first upper surface E1 of the etch stop pattern (ES) may be less recessed, and accordingly, the first upper surface T1 of the upper electrode TE may be less affected by the etchant in the second direction D2 and may be recessed relatively less.

According to an embodiment of the present inventive concept, the etch stop pattern ES may be provided on the upper surface of the filling pattern FIL and the side surface of the upper electrode TE. In an embodiment, the etch stop pattern ES may include an insulating material with a slower etch-rate than the filling pattern FIL based on the etchant used in the formation process of the bit line BL. Alternatively, in a comparative embodiment the etch stop pattern ES may not be provided, and a filling pattern FIL with a high etch-rate based on the etchant may be provided on the side surface of the upper electrode TE. In this comparative embodiment, when forming the bit line BL, a portion of the upper surface of the filling pattern FIL may be excessively recessed, and accordingly, the first upper surface T1 of the upper electrode TE may be excessively recessed. As a result, the selection element OTS may be exposed to the outside and may be damaged by the etchant used in the bit line BL formation process. However, in an embodiment of the present inventive concept, the first upper surface T1 of the upper electrode TE may be less recessed, by providing the etch stop pattern ES. Accordingly, the selection element OTS may not be exposed to the outside and may not be damaged by the etchant. As a result, reliability of the semiconductor device may be increased.

In addition, the first upper surface T1 of the upper electrode TE may be less recessed, and thus the upper electrode TE may have a sufficient first height H1. In this case, even when a second height H2 of the upper electrode TE is formed to be relatively less, the selection element OTS may not be exposed to the outside when forming the bit line BL. Accordingly, according to an embodiment of the present inventive concept, the second height H2 of the upper electrode TE may be made smaller, and as a result, integration of the semiconductor device may be increased.

Referring to FIGS. 3 and 4A to 4C, the memory cell MC and the etch stop pattern ES may be formed using the second mask patterns MK2 as an etch mask. Accordingly, one memory cell MC may be divided into memory cells MC spaced apart from each other in the first direction D1. In addition, one etch stop pattern ES may be divided into the etch stop patterns ES spaced apart from each other in the first direction D1. In an embodiment, during the removal process, a portion of the upper surface of the filling pattern FIL may be recessed. Accordingly, the filling pattern FIL may be formed to have the first upper surface F1 below the bit line BL and the recessed second upper surface F2.

Thereafter, the second mask patterns MK2 may be removed, and the insulating pattern IS may be formed between a region where the memory cell MC is removed, a region where the filling pattern FIL is removed, and the bit lines BL.

Figure 12:
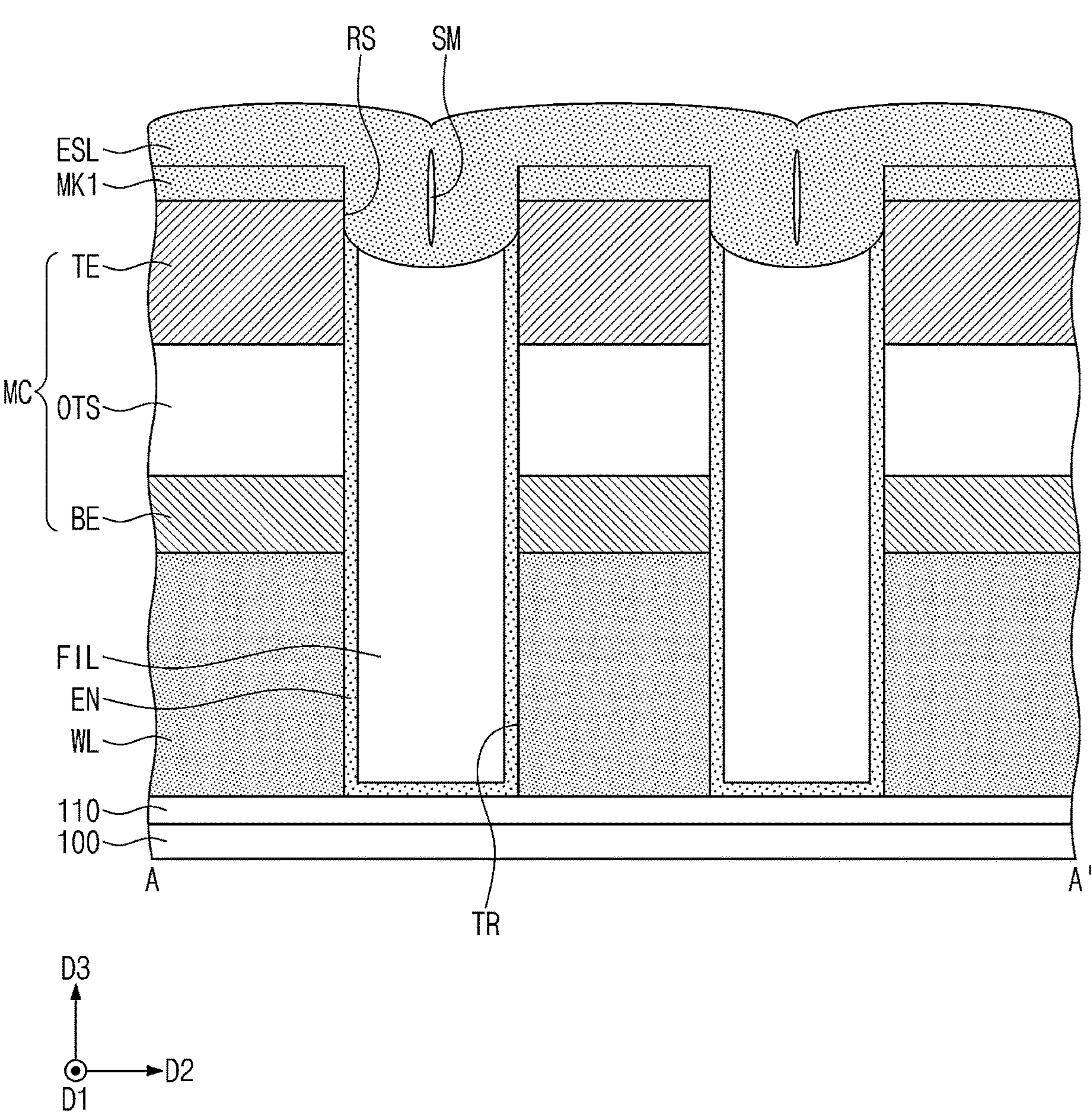
FIG. 12 is a cross-sectional view corresponding to line A-A' in FIG. 8 according to an embodiment of the present inventive concept.

FIG. 12 is a cross-sectional view illustrating a method of manufacturing a semiconductor device according to an embodiment of the present inventive concept.

Referring to FIG. 12, when forming the etch stop layer ESL described with reference to FIGS. 8, 9A, and 9B, a seam SM may be formed inside the etch stop layer ESL. In an embodiment, the seam SM may be formed by depositing and meeting the etch stop layer ESL from both inner surfaces of the recess region RS.

Thereafter, the semiconductor device described with reference to FIG. 5 may be formed using the method of manufacturing the semiconductor device described above.

According to an embodiment of the present inventive concept, the etch stop pattern may be provided on the upper surface of the filling pattern and on the sides of the upper electrode. The etch stop pattern may include the insulating material having the slower etch-rate than the filling pattern based on the etchant used in the forming of the bit line. When forming the bit line, the first upper surface of the etch stop pattern may be less recessed, and accordingly, the first upper surface of the upper electrode may be less recessed. As a result, the selection element may not be exposed to the outside and may not be damaged by the etchant. Accordingly, the reliability of the semiconductor device may be increased.

In addition, the first upper surface of the upper electrode may be less recessed, and thus the upper electrode may have the sufficient first height. In this embodiment, even when the second height of the upper electrode is formed to be relatively smaller, the selection element may not be exposed to the outside when forming the bit line. Accordingly, an embodiment of the present inventive concept may make the second height of the upper electrode smaller, and as a result, the integration of the semiconductor device may be increased.

While embodiments are described above, a person skilled in the art may understand that many modifications and variations are made without departing from the spirit and scope of the present inventive concept. Accordingly, the described embodiments should be considered in all respects as illustrative and not restrictive of the spirit and scope of the present inventive concept.

What is claimed is:

1. A semiconductor device comprising:
- a word line extending in a first direction;
- a bit line extending on the word line in a second direction intersecting the first direction;
- a memory cell disposed between the word line and the bit line, the memory cell including a lower electrode, a selection element, and an upper electrode sequentially disposed on the word line;
- a filling pattern on a side surface of the memory cell; and
- an etch stop pattern including an insulating material between the filling pattern and the bit line,
- wherein a lower surface of the etch stop pattern is positioned at a higher level than a level of a lower surface of the upper electrode.

2. The semiconductor device of claim 1, wherein the etch stop pattern includes silicon nitride (SiN).

3. The semiconductor device of claim 1, wherein the filling pattern includes a low-k material.

4. The semiconductor device of claim 1, wherein the etch stop pattern includes a material having a lower etch-rate than an etch-rate of the filling pattern.

5. The semiconductor device of claim 1, wherein the etch stop pattern includes a seam therein.

6. The semiconductor device of claim 1, wherein:
- the filling pattern has a first upper surface below the bit line; and
- the first upper surface of the filling pattern is positioned at a higher level than the level of the lower surface of the upper electrode.

7. The semiconductor device of claim 6, wherein the etch stop pattern is disposed directly on the first upper surface of the filling pattern.

8. The semiconductor device of claim 1, wherein the filling pattern extends along a side surface of the upper electrode.

9. The semiconductor device of claim 1, further comprising a protective layer between the memory cell and the filling pattern.

10. The semiconductor device of claim 1, wherein the selection element includes a chalcogenide material.

11. The semiconductor device of claim 1, wherein:
- the word line includes first and second word lines extending in the first direction and spaced apart from each other in the second direction; and
- the memory cell includes a first memory cell between the first word line and the bit line and a second memory cell between the second word line and the bit line,
- wherein the etch stop pattern is interposed between the first and second memory cells.

12. The semiconductor device of claim 1, wherein the upper electrode is in direct contact with an upper surface of the selection element and a lower surface of the bit line.

13. A semiconductor device comprising:
- a word line extending in a first direction;
- a bit line extending on the word line in a second direction intersecting the first direction;
- a memory cell disposed between the word line and the bit line, the memory cell including a lower electrode, a selection element, and an upper electrode sequentially disposed on the word line;
- a filling pattern on a side surface of the memory cell; and
- an etch stop pattern including an insulating material, the etch stop pattern is disposed between the filling pattern and the bit line,
- wherein the filling pattern has a first upper surface below the bit line, and
- wherein the first upper surface of the filling pattern is positioned at a higher level than a level of a lower surface of the upper electrode.

14. The semiconductor device of claim 13, wherein the etch stop pattern includes silicon nitride (SiN).

15. The semiconductor device of claim 13, wherein the etch stop pattern includes a material having a lower etch-rate than an etch-rate of the filling pattern.

16. The semiconductor device of claim 13, wherein the etch stop pattern includes a seam therein.

17. The semiconductor device of claim 13, wherein the upper electrode is in direct contact with an upper surface of the selection element and a lower surface of the bit line.

18. A semiconductor device comprising:
- a word line extending in a first direction;
- a bit line extending on the word line in a second direction intersecting the first direction;
- a memory cell disposed between the word line and the bit line, the memory cell including a lower electrode, a selection element, and an upper electrode sequentially disposed on the word line;
- a filling pattern on a side surface of the memory cell; and
- an etch stop pattern including an insulating material between the filling pattern and the bit line, wherein the upper electrode is in direct contact with an upper surface of the selection element and a lower surface of the bit line, and wherein a lower surface of the etch stop pattern is positioned at a higher level than a level of a lower surface of the upper electrode.

19. The semiconductor device of claim 18, wherein the etch stop pattern includes silicon nitride (SiN).

20. The semiconductor device of claim 18, wherein the etch stop pattern includes a material having an etch-rate that is lower than an etch-rate of the filling pattern.

* * * * *